United States Patent [19]

Richardson

[11] Patent Number: 4,495,499
[45] Date of Patent: Jan. 22, 1985

[54] INTEGRATED OSCILLATOR-DUPLEXER-MIXER

[76] Inventor: David Richardson, 2588 Knightsbridge La., Santa Clara, Calif. 95050

[21] Appl. No.: 299,656

[22] Filed: Sep. 8, 1981

[51] Int. Cl.³ .............................................. G01S 9/00
[52] U.S. Cl. ............................. 343/5 DD; 343/5 PD
[58] Field of Search ........... 343/5 PD, 5 TM, 5 DD, 343/7.7; 340/552, 561; 455/86

[56] References Cited

U.S. PATENT DOCUMENTS

| | | | |
|---|---|---|---|
| 3,805,262 | 4/1974 | Klein et al. ...................... | 343/5 PD |
| 3,886,549 | 5/1975 | Cheal et al. .......................... | 343/7.7 |
| 4,200,870 | 4/1980 | Gabbitas ........................... | 343/5 PD |
| 4,443,796 | 4/1984 | Müller ................................. | 343/772 |

Primary Examiner—Sal Cangialosi
Assistant Examiner—Gregory C. Issing
Attorney, Agent, or Firm—John Schipper

[57] ABSTRACT

Combined microwave oscillator, duplexer and mixer apparatus for sensing motion of adjacent objects through use of Doppler-shifted electromagnetic radiation reflections from the objects, with second order and higher even order harmonic emissions being suppressed by modification of the oscillator apparatus.

30 Claims, 12 Drawing Figures

INTEGRATED OSCILLATOR-DUPLEXER-MIXER

Field of the Invention

The invention relates to electronic sensing of a stationary or moving object by sensing the shift of frequency between radiation emitter toward and reflected by the object.

BACKGROUND OF THE INVENTION

Motion sensors and distance sensors have many applications (door openers, automatic conveyor line control, velocity measuring devices, collision avoidance devices, etc.); but their application in intrusion alarms, alias burglar alarms for securing an interior area, is probably the best known. One class of motion sensors emits radiation of a (hopefully) well-controlled and predetermined frequency ($\omega_O$), which is reflected by an object in motion in the secured area and returns to the sensor as a (weak) signal with Doppler-shifted frequency ($\omega_O \pm \omega_{DS}$), the Doppler-shift being a measure of the component of the moving object's vector velocity in the direction of the sensor.

All motion sensors and distance sensors utilizing microwave or other similar radiation rely initially upon generation of radiation of the predetermined frequency in an appropriate cavity and emission of this radiation from an adjacent, related structure. Generally, the cavity used for generation supports both the frequency of interest and several higher harmonics; and the apparatus may emit these higher harmonics as well, often violating the Federal Communication Commission standards for the permissible frequency range in which motion sensors may be operated. Conventional motion sensors, if they address this higher harmonic problem at all, usually include an elaborate addon device to suppress, with indifferent success, the radiation modes corresponding to these unwanted higher harmonics.

Further, in most conventional motion sensors and distance sensors, separate but adjacent mixer apparatus must be provided for sensing the return signal with its Doppler-shifted frequency and for comparing the return frequency with the emitted or reference frequency; that is, the mixer appratus and the reference frequency generator and emitter apparatus are not truly integrated.

SUMMARY OF THE INVENTION

The object of the subject invention is to provide an integrated oscillator-duplexer-mixer apparatus for use in sensing motion of adjaent objects relative to the apparatus by use of Doppler-shifted electromagnetic radiation that is reflected from the moving object, wherein second harmonic radiation is suppressed by modifications of the oscillator.

Another object is to provide compact oscillator-duplexer-mixer apparatus wherein the duplexer cavity also serves as part of the mixer.

Another object of the subject invention is to provide an integrated oscillator-duplexer-mixer apparatus for use in sensing the distance to adjacent objects from the apparatus by use of the time delay of frequency or phase modulated electromagnetic radiation that is reflected from the object.

Another object of the invention is to provide an integrated oscillator-duplexer-mixer apparatus for use in simple low power frequency or phase modulation communication systems.

Other objects of the invention and advantages thereof will become clear by reference to the detailed description and the accompanying drawings.

The invention achieves its objects through use of apparatus comprising, in one embodiment, a grounded metal body having a front face and having two adjacent, nonoverlapping cylindrical cavities with substantially parallel cylinder axes therein, with the front end of each cavity terminating on the front face of the body and the rear end of each cavity terminating on a rear wall within the body interior; a smaller, cylindrical cavity communicating with the first two cavities and having a cylinder axis substantially perpendicular to the cylinder axes of the first two cylinder cavities, with this third cylinder axis being positioned substantially midway between the front face and the rear wall of the first cavity; a Gunn diode, or other microwave generating device, positioned in or contiguous to the first cavity, to generate electromagnetic vibrations of a predetermined frequency within the first cavity; a small cylindrical mixer slot cavity, positioned in the body adjacent to and communicating with the second cylindrical cavity and having a cylinder axis that is substantially perpendicular to the cylinder axes of the second and third cylindrical cavities; a mixer diode and associated low pass filter combination, positioned in or contiguous to the mixer slot cavity, for sensing the presence of and forming the product of two distinct electromagnetic vibration signals and for passing only components of the resulting product signal that have a frequency less than some predetermined frequency; and horn means, mechanically attached to the body and communicating with the second cylindrical cavity at the front end of the cavity, for limiting the direction of radiation emitted from or received by the cavity.

DETAILED DESCRIPTION

The subject invention is an integrated oscillator-duplexer-mixer apparatus suitable for use as a motion sensor or distance sensor for adjacent objects or for voice-modulated, two-way microwave communication. The invention in one embodiment radiates electromagnetic energy of one predetermined frequency, $\omega_O$, (or more accurately, in a very narrow band of frequencies surrounding the predetermined frequency) and subsequently senses the "return" of radiation of a different, Doppler-shifted frequency, $\omega = \omega_O \pm \omega_{DS}$, reflected from a moving object within the path of radiation initially emitted by the apparatus. The frequency shift $\omega_{ds} = -\alpha \omega_O v_{11}$ ($v_{11}$ in ft./sec.) is a measure of the velocity $V_{11}$ of the moving object sensed parallel to the direction of propagation of the initially emitted radiation at the object. If, for example, the predetermined frequency is $\omega_O = 10.525$ GHz, the constant of proportionality in Eq. (1) becomes $\alpha = 21.40$.

Figure 1:
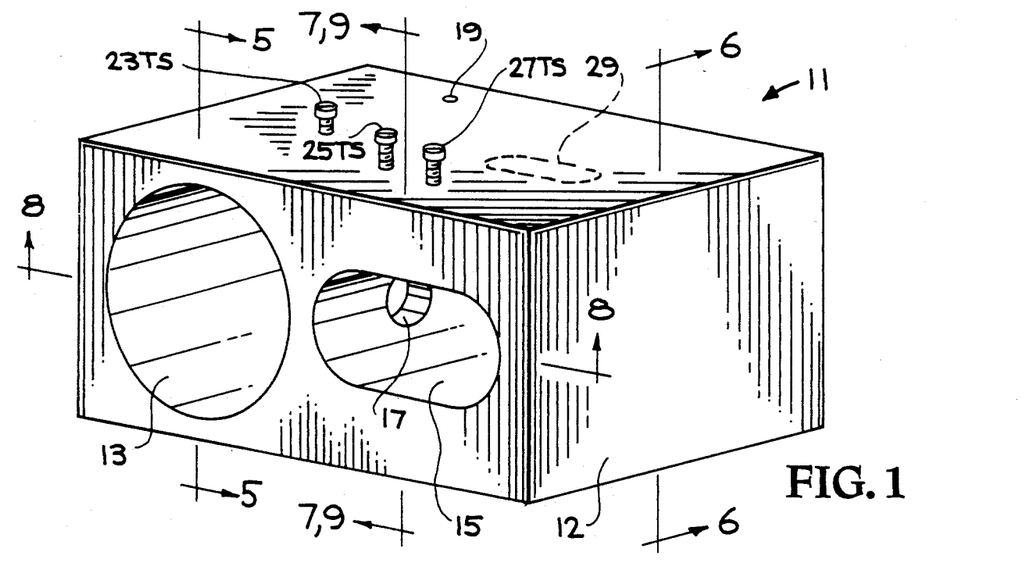
FIG. 1 is an isometric front/side/top view of apparatus incorporating the preferred embodiment of the motion sensor invention, with horn and oscillator cavity front cover removed for clarity.

With reference to FIG. 1, the apparatus includes a metallic, grounded body 11 that may be a rectangular parallepiped as shown or any other convenient shape having a front face 12. A cylindrical cavity 13 (substantially circular in FIG. 1, the oscillator cavity) is cut in the face 12 of the body 11, with the rear end of the cavity terminating on a rear wall 13RW (FIG. 3) in the interior of the body 11. The cavity 13 might also have an elliptical or oval or rectangular or convex polygonal or other cross section. The front face of the cavity 13 is normally covered with metallic material 14 that has substantially the same characteristics as the body 11, to form a substantially closed cavity 13 for microwave generation purposes. A second cylindrical cavity 15 (the duplexer cavity) having an arbitrary cross section (oval in FIGS. 1-4, hereinafter called an "ovular" cavity) is also cut in the face 12 of the body 11 adjacent to the first cylindrical cavity 13, with the second cylinder axis being substantially parallel to the first cylinder axis and with the rear end of the second cylindrical cavity also terminating on a rear wall 15RW (FIG. 3) in the interior of the body 11.

A third cylindrical cavity 17 of arbitrary cross section (circular in FIG. 1) is cut in the interior of the body 11, between the first cavity 13 and the second cavity 15, with the axis of the third cylindrical cavity 17 (the iris cavity) being substantially parallel to the front face of the body 11. The diameter of the iris cavity 17 is chosen to be $\leq 25\%$ of the diameter of the oscillator cavity 13. The cavities 13 and 15 communicate with one another through the iris cavity 17.

Figure 11:
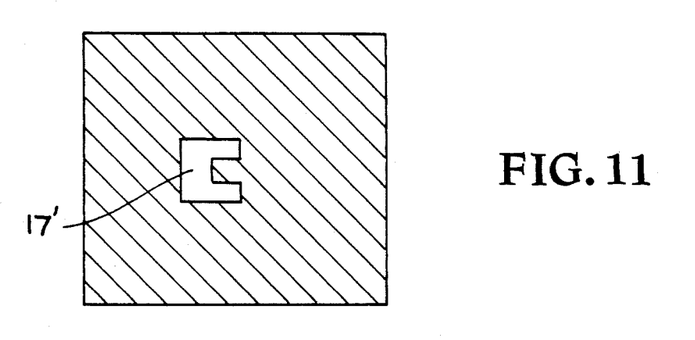
FIG. 11 is a side view of a non-convex polygon cross-sectional shape for use with the iris cavity.

As noted above, the cross sections of the first and second cylindrical cavities 13 and 15 may be substantially circular, ovular, elliptical, rectangular or convex polygonal; and the third cylindrical cavity 17 may have a cross section that is any of the above or may be non-convex polygonal, such as the cross section shown in FIG. 11.

Figure 2:
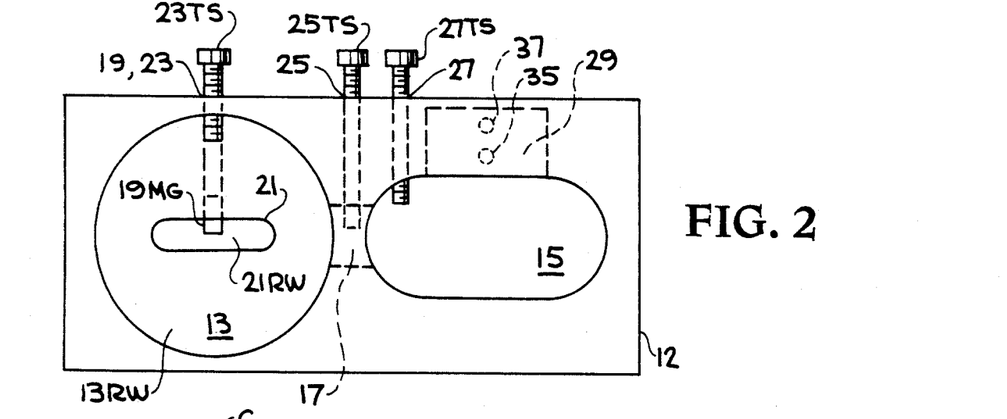
FIGS. 2, 3 and 4 are, respectively, front, top and rear views of the apparatus of FIG. 1, with dotted lines indicating the placement of various cylindrical apertures and cavities in the body of the apparatus.
Figure 3:
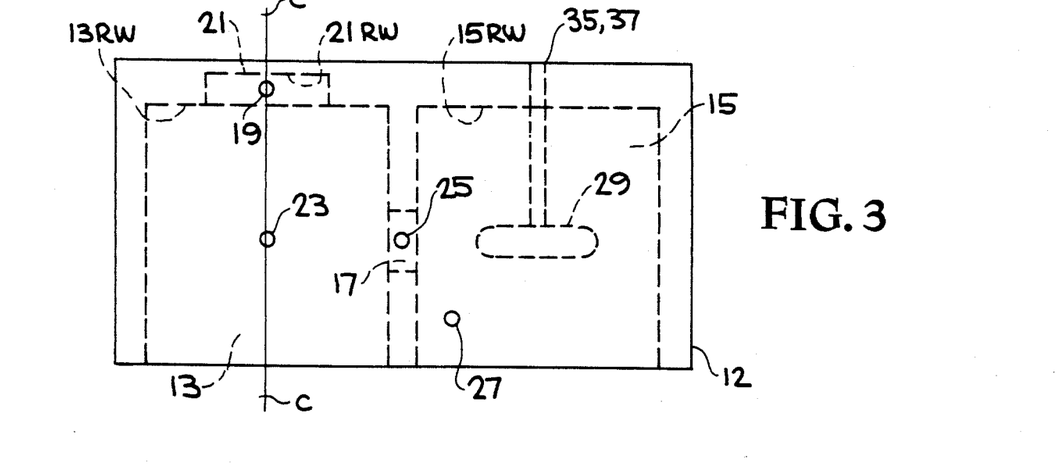

A fourth cylindrical cavity 19 (FIGS. 1 and 2), substantially perpendicular to the direction of the cylinder axis CC of the circular cylindrical cavity 13 and passing through the axis CC at one point as shown FIG. 1, is now cut in the rear wall 13RW of the body 11 as shown; and a Gunn diode 19MG, or other microwave generating device such as an FET transistor, bipolar transistor, avalanche transistor or tunnel diode, is inserted in the cavity 19 to generate electromagnetic oscillations of fixed orientation within the oscillator cavity 13. A small cylindrical cavity 21, substantially centered on the cylinder axis CC of the oscillator cavity 13, is now cut in the rear wall 13RW of the cavity 13 as shown in FIGS. 2 and 3 to expose a portion of the microwave generating device 19MG. The front face of the cavity 21 terminates on a rear wall 21RW within the body 11 as shown in FIG. 3.

The oscillator cavity 13 is also provided with an oscillator tuning screw 23TS, inserted substantially vertically at the top of the cavity through an aperture 23 (FIGS. 1-4), to fine tune the cavity for production of the precise electromagnetic frequency $\omega_O$ that is desired. The iris cavity 17 is also provided with an iris tuning screw 25TS, inserted at the top of the iris through another aperture 25. Finally, the duplexer cavity 15 is provided with a horn-duplexer tuning screw 27TS that is inserted at the top of the duplexer cavity through an aperture 27. The positions of these respective tuning screws (i.e., their positions at the top of the respective cavities) are not crucial, and each tuning screw could be oriented to intrude into its cavity from almost any direction. The use of tuning screws is optional here; but their careful use does improve the performance.

Figure 4:
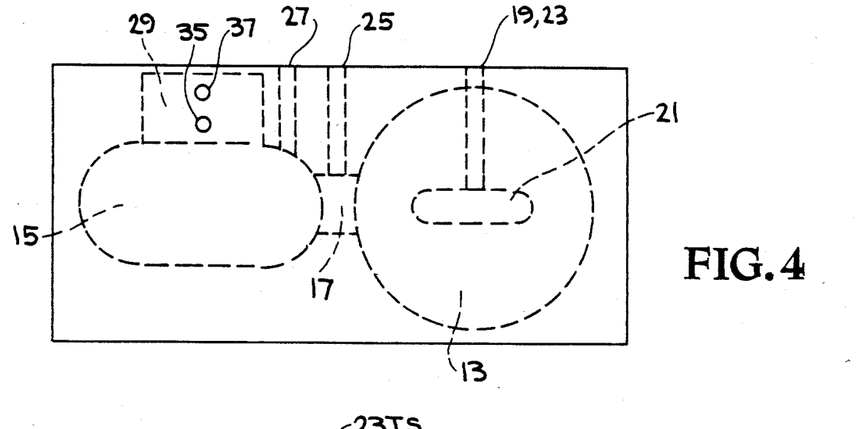

The body 11 is also provided with a cylindrical mixer slot cavity 29, formed as a cylinder, with axis orthogonal to those of the cavities 15 and 17, that communicates with the duplexer cavity 15 at the top (or, alternatively, at the bottom) of the cavity 15 as indicated in FIG. 3 and is closed at the other end. The mixer slot cavity 29 is itself provided with a mixer tuning screw 37TS that is inserted substantially horizontally at the rear wall (or, alternatively, the front wall) of the cavity 29 through an aperture 37 (FIG. 4).

Figure 5:
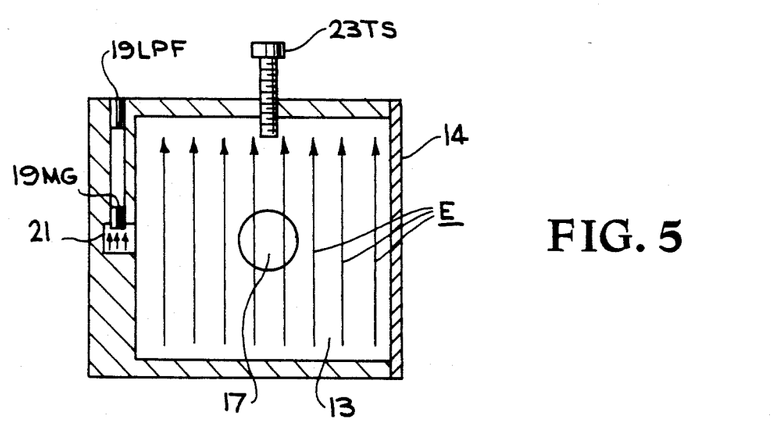
FIG. 5 is a side cross-sectional view of the oscillator cavity of FIG. 1, showing the position of the (circular) iris and showing the orientation of the electric field vector within the oscillator cavity.

FIG. 5 is a side cross-sectional view of the oscillator cavity 13, with the arrows showing the local direction of the electric field vectors E produced by operation of the microwave generating device 19MG of FIG. 2. A low pass filter 19LPF may be positioned in the cavity 19 between the device 19MG and the atmosphere, to suppress or substantially eliminate all the high frequency radiation generated by the device 19MG that would otherwise be emitted from the oscillator cavity. In practice, a circular cylindrical cavity 13 (unperturbed by the presence of any other apertures such as 17) of diameter 2R and length L will support a sequence of eigenfrequencies $\omega$ of electromagnetic vibration given by $$J_m\left(\sqrt{-k_p^2 + \frac{\omega^2}{c^2}}\, R\right) = 0, \qquad (2)$$

$J_m$ = Bessel function of first kind of order $m$ (= 0, 1, 2, ...), $k_p = \frac{2\pi p}{L}$ ($p = 0, 1, 2, ...$), or some variant of this consistent with Maxwell's equation, with the cross sectional shape and with the boundary conditions imposed for the cavity cross section. For the dimensions of interest here (L, R of the order of a few cm), the lowest order $\omega_{m,n,P} = \omega_{0,0,1}$ would be of the order of $2\pi \times 10^{10}$ rad/sec.

Figure 6:
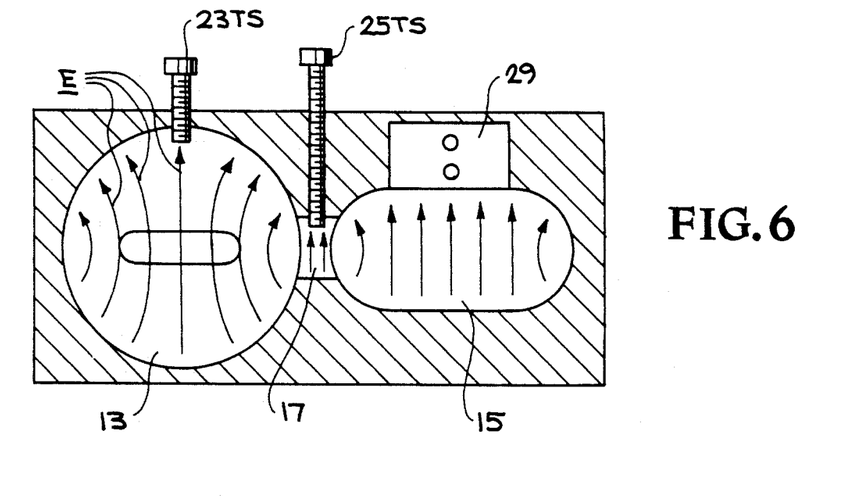
FIG. 6 is a front cross-sectional view of oscillator and duplexer cavities and the iris cavity therebetween, showing the orientation of the electric field vector within these cavities.
Figure 7:
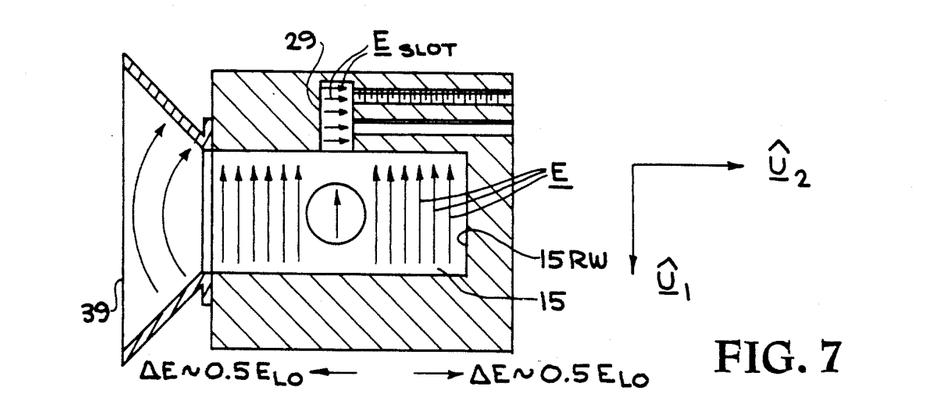
FIG. 7 is a side cross-sectional view of the duplexer and mixer slot cavities, showing the required orientations of the electric field vector within these cavities.
Figure 8:
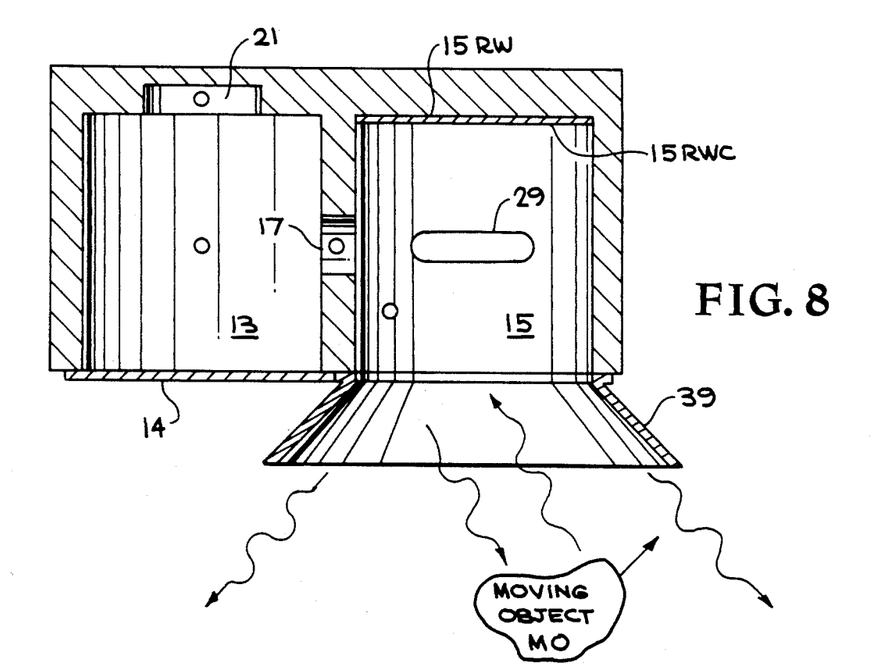
FIG. 8 is a top cross-sectional view of the apparatus showing emission of an initial signal ($\omega = \omega_O$) and the signals reflected and returned ($\omega = \omega_O \pm \omega_{DS}$) from a moving object.

The presence of the small iris cavity or aperture 17 as a part of the wall of the cavity 13 allows a small portion of the electromagnetic energy filling the cavity 13 to pass through the aperture 17 to the adjacent duplexer cavity 15, as suggested by the front cross-sectional view of 13, 15, and 17 shown in FIG. 6. At this point, the energy of local oscillation, $E_{LO}$, that moves from oscillator cavity 13 to duplexer cavity 15 splits approximately equally, with substantially 50% of $E_{LO}$ propagating toward the open end of the duplexer cavity, where a horn, 39, is attached to the body 11 as shown in FIGS. 7 and 8; and with the remainder of the energy $E_{LO}$ propagating toward the closed end 15RW of the cavity 15, as indicated in FIG. 7. Initially, the electric field vector of the electromagnetic radiation as it issues from the iris cavity 17 is parallel to the vector $\hat{U}_1$ of FIG. 7 so that none of this energy can propagate in the adjacent mixer slot cavity 29 as this propagation requires a transverse electric field vector as shown.

As indicated in FIG. 8, the portion of the energy of local oscillation that propagates initially toward the front face 12 (FIG. 1), passes through the horn and is radiated outward. Assuming, for definiteness, that the radiated energy ($\omega = \omega_O$) strikes a moving object MO, the return signal (much weaker) will have a characteristic angular frequency $\omega_r = \omega_O \pm \omega_{DS}$, where the Doppler-shift $\omega_{DS}$ is a linear measure of MO's (vector) velocity projected upon a line parallel to the direction of propagation of the initially emitted radiation (from 39), $V_{11}$, as determined in Eq. (1). A portion of the (weaker) return signal returns to the duplexer cavity 15 through the horn 39, as suggested in FIG. 8, and propagates more-or-less toward the rear wall 15RW.

The portion of local oscillator energy $E_{LO}$ that initially proceeds toward the rear wall 15RW in the cavity 15 is partially reflected at 15RW, and a reduced portion (of frequency $\omega = \omega_O$) returns toward the front. The rear wall 15RW may optionally be provided with an overlay or coating 15RWC of material having a particular reflection coefficent at frequency $\omega = \omega_O$; two examples are iron oxide and iron particles. Some, but not necessarily all, of the local oscillation energy $\Delta E \sim 0-.5E_{LO}$ that initially proceeds toward 15RW will be reflected and returned toward the slot mixer cavity 29. Portions of the return signal (of frequency $\omega = \omega = \omega_O \pm \omega_{DS}$) and the rear wall-reflected signal (of frequency $\omega = \omega_O$) now have components of electric vectors, E, that are parallel to the unit vector $\hat{U}_2$ (FIG. 7) and can propagate into the mixer slot cavity 29 as suggested by FIG. 7. The slot cavity 29 contains a mixer diode 35D and is tuned, using the (optional) tuning screw 37TS if necessary, so that the cavity is resonant for the frequency $\omega = \omega_O$.

If the portions of rear wall-reflected signal and return signal propagating in the slot cavity 29 are represented by $A_{LO} \sin \omega_O t$ and $A_r \sin [\omega_O \pm \omega_{DS}) t + \phi]$, respectively, the mixer diode 35MD in the mixer slot cavity 29 aperture 35 (FIGS. 3, 4 and 9) will produce substantially a product signal $$S = \tfrac{1}{4} A_{LO} A_r [1 - \cos 2\omega_O t] \cos (\pm \omega_{DS} t + \phi) + \quad (3)$$
$$\sin (2\omega_O t) \sin (\pm \omega_{DS} t + \phi)$$

Figure 9:
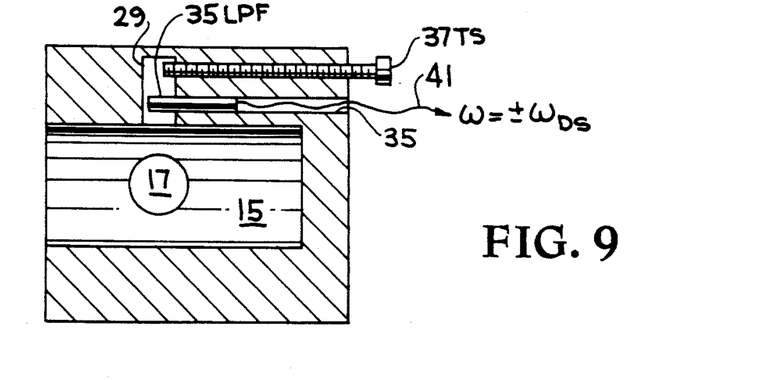
FIG. 9 is a side cross-sectional closeup view of the mixer slot cavity, showing a suitable position for the associated mixer diode and low pass filter.

If the signal S is now passed through a suitable low pass filter 35LPF, also inserted in the mixer slot cavity 29 as shown in FIG. 9, only the low frequency component $S_{LPF} = (\tfrac{1}{4}) A_{LO} A_r \cos (\pm \omega_{DS} t + \phi)$ will survive and pass from the mixer slot cavity 29 aperture along the signal line 41 provided.

The signal $S_{LPF}$ is now passed to a threshold descriminator circuit that determines whether a moving target has been sensed, by comparing the amplitude, $A_S$, of the associated frequency $\pm \omega_{DS}$, if any, with a threshold amplitude $A_{THR}$. If $A_S \geq A_{THR}$, the circuit determines that a moving target is present and an alarm may be sounded. If $A_S < A_{THR}$, the circuit determines that no moving target has been sensed.

Figure 10:
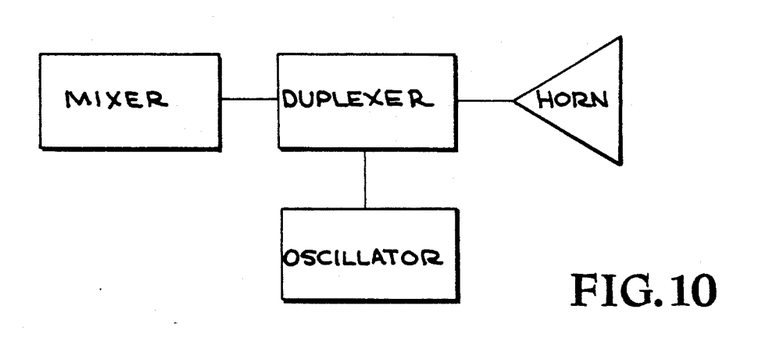
FIG. 10 is a schematic view of the four main functional components of the motion sensor apparatus.

FIG. 10 is a simple schematic showing the basic functions of the invention and one embodiment of the spatial relationships of the integrated devices that perform these functions.

Under ordinary circumstances, the substantially closed cavity 13 would generate the fundamental frequency $\omega_{0,0,1}$ and higher harmonics $\omega_{0,0,P}(P=2, 3, \ldots)$ as well as other determined by Eq. 2. The higher harmonics $\omega_{0,0,P}$ are especially troublesome and must be suppressed. In the prior art, this is ordinarily accomplished in the duplexer cavity and horn area by inclusion of an elaborate mechanical structure designed to suppress some or all of these higher harmonics.

The preferred embodiment of my invention accomplishes this by the use of symmetry within the oscillator cavity 13 so that the second harmonic in particular is suppressed; harmonics higher than the second have generally much lower amplitudes and can be ignored here vis-a-vis the amplitude of the fundamental frequency $\omega_O = \omega_{0,0,1}$. Suppression of the second harmonic occurs in part by positioning the center of the iris circular cross section so that it coincides with a point (on the longitudinal axis CC of the cavity 13) of substantially maximum amplitude of the fundamental frequency and, simultaneously, with a nodal point for $\omega_{0,0,2}$. Normally, this requires that the iris center be positioned substantially mid-way between the rear wall 13RW and the front face 12 of the oscillator cavity 13.

The subject invention provides an integrated oscillator, duplexer and mixer, using a mid-cavity oscillator sidewall iris for second harmonic suppression; orthogonally oriented duplexer and slot mixer cavities; and (optional) adjustable reflection of electromagnetic radiation from the rear wall of the duplexer cavity. The unit is especially compact and has application in the areas of intrusion alarms, door openers, automatic conveyor line control in manufacturing processes, velocity measuring devices, vibration analyzers and collision avoidance devices (e.g., in ship docking).

Figure 12:
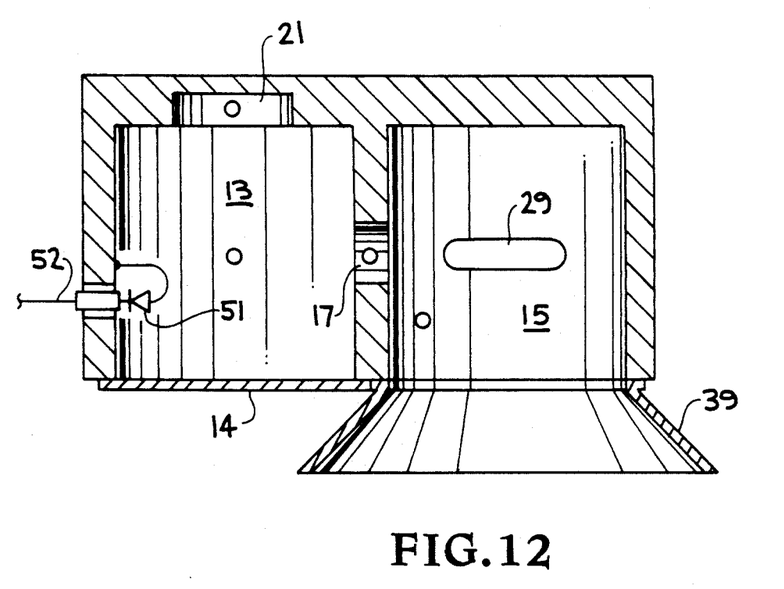
FIG. 12 is a top cross-sectional view of the apparatus in an embodiment suitable for use as a distance sensor or frequency or phase-modulated two-way communication device.

In order to use the subject invention either to sense the distance to adjacent objects or as part of a communication system, it is merely necessary to add an additional modulation tuning element, a cavity resonant frequency dynamic variation means, to supplement the cavity tuning screw, 23, where, instead of the mechanically variable perturbation of the cavity frequency, $\omega_O$ produced by varying the penetration of the tuning screw 23, a time varying electrical perturbation of the cavity frequency $\omega_O$ is produced by applying a modulation signal to terminal 52 of the modulation timing element, 51 (FIG. 12). One common form of modulation tuning element uses a varactor diode or variable capacitance semiconductor diode inserted partially into the cavity side wall or end wall, in a manner well known in the art.

When the subject invention is used to sense distance to adjacent objects a repetitive time varying signal is applied to 52, which in turn causes a frequency modulated signal to be emitted from the front of horn 39 and also to be applied to the mixer diode 35MD. The portion of the emitted wave is reflected from a stationary adjacent object also is applied to the mixer diode. Due to the round trip propagation time to and from the adjacent object, a different frequency is produced at the output of the mixer, which is typically in the subaudio-to-audio range for nearby objects. The frequency of the difference signal is proportional to the distance to the adjacent object just as the frequency of the difference signal is proportional to the radial velocity of a moving object for the motion sensing previously described.

When the subject invention is used in a communication system in the transmit mode, the modulation signal containing the information to be transmitted is applied to the modulation signal input terminal 52 of the modulation tuning element 51, which in turn causes a frequency or phase modulated signal to be emitted from horn 39. In the receive mode, no signal is applied to the modulation tuning element but an incoming FM signal from another remote unit being used in the transmit mode is applied to the mixer diode and, together with the direct signal from the local oscillator cavity, produces a difference frequency that may be demodulated to provide a replica of the modulation signal information originally transmitted from the remote unit.

Although the preferred embodiments of the invention have been shown and described herein, variation and modification may be made without departing from what is regarded as the scope of the invention.

I claim:

1. Integrated oscillator-duplexer-mixer apparatus for use in sensing motion of adjacent objects by use of Doppler-shifted, reflected radiation, the apparatus comprising:

a grounded, metal body having a front face and a first cylindrical cavity, closed at the cavity front and rear end, with cylinder axis substantially perpendicular to the front face of the body, with the front end of the cavity terminating adjacent to the front face of the body and with the rear end of the cavity terminating within the body;

the body having a second cylindrical cavity, at the side of and adjacent to, and having a cylindrical axis substantially parallel to the axis of, the first cylindrical cavity, with the front end of the second cavity being open and terminating on the front face of the body and the rear end of the second cavity terminating within the body;

the body having a third substantially cylindrical cavity, communicating with the first cylindrical cavity and with the second cylindrical cavity and the interior of the body, having a cylindrical axis that is substantially parallel to the front face of the body and having a cylindrical diameter that is no more than 25% of the diameter of the first cylindrical cavity, with the third cavity cylinder axis being positioned substantially equidistant from the rear end and the front end of the first cylindrical cavity;

microwave generating means, positioned adjacent to the rear end of and in electromagnetic communication with the first cylindrical cavity, for generating electromagnetic vibrations of a predetermined frequency $\omega_O$ within the first cylindrical cavity;

the body having a cylindrical, mixer slot cavity, positioned adjacent to and in communication with the second cylindrical cavity, with a cylindrical axis that is substantially perpendicular to the cylinder axis of the second and third cylindrical cavities;

a mixer diode, positioned in the mixer slot cavity and oriented to sense electromagnetic vibration signals propagating within the slot cavity, for sensing the presence of two or more distinct electromagnetic vibration signals and for forming the product signal of such distinct signals;

low pass filter means, electrically connected to the mixer diode, for receiving the mixer diode product signal and allowing the passage only of product signals with resulting frequencies less than some predetermined threshold frequency, $\omega_T \leq 2 \times 10^8$ rad/sec, in response to receipt of an electromagnetic vibration signal of arbitrary frequency components from the mixer diode; and horn means mechanically attached to the body and communicating with the second cylindrical cavity at the open front end of the cavity, for limiting the direction of radiation emitted from or received by the cavity.

2. Apparatus according to claim 1, wherein said microwave generating means is drawn from a class consisting of Gunn diodes, FET transistors, bipolar transistors, avalanche transistors and tunnel diodes.

3. Apparatus according to claim 1, wherein the cross-sectional shape of said first cylindrical cavity is drawn from a class consisting of a circle, an oval, an ellipse, a rectangle and a convex polygon.

4. Apparatus according to claim 1, wherein the cross-sectional shape of said second cylindrical cavity is drawn from a class consisting of a circle, an oval, an ellipse, a rectangle and a convex polygon.

5. Apparatus according to claim 1, wherein the cross-sectional shape of said third substantially cylindrical cavity is drawn from a class consisting of a circle, an oval, an ellipse, a rectangle and a polygon.

6. Apparatus according to claim 1, wherein said first cylindrical cavity includes a tuning screw intruding into said first cavity for adjusting the fundemental resonant frequency for electromagnetic vibrations within said first cavity.

7. Apparatus according to claim 1, wherein said second cylindrical cavity includes a tuning screw intruding into said second cavity for adjusting the resonant frequencies for electromagnetic vibration within said second cavity.

8. Apparatus according to claim 1, wherein said third substantially cylindrical cavity includes a tuning screw intruding into said third cavity for adjusting the resonant frequencies for electromagnetic vibration within said third cavity.

9. Apparatus according to claim 1, wherein said mixer slot cavity includes a tuning screw intruding into said mixer cavity for adjusting the resonant frequencies for electromagnetic vibration within said mixer cavity.

10. Apparatus according to claim 1, further including an oscillator low pass filter, adjacent to said first cylindrical cavity and operationally associated with said microwave generating means, for suppressing the emission of radiation from said first cavity at frequencies above a predetermined second threshold frequency $\omega_{LP}$.

11. Apparatus according to claim 1, further including a small cavity in said rear end of said first cylindrical cavity, the cavity containing and exposing at least a portion of said microwave generating means.

12. Apparatus according to claim 11, further including a tuning screw intruding into said rear end cavity of said first cylindrical cavity for suppressing the excitation of one or more predetermined modes of electromagnetic vibration that would otherwise be excited by said microwave generating means.

13. Apparatus according to claim 1, wherein said predetermined threshold frequency $\omega_T$ satisfies $\omega_T \leq 2\pi \times 30$ rad/sec.

14. Apparatus according to claim 1, wherein said rear end of said second cylindrical cavity includes an overlay or coating of material chosen to reflect electromagnetic vibrations of frequency $\omega_O$ in a predetermined manner.

15. Apparatus according to claim 14, wherein said over-lay or coating material is chosen from the class consisting of iron oxide and iron particles.

16. Integrated oscillator-duplexer-mixer apparatus for sensing the distance of an object or for frequency or phase modulated two-way communication, the apparatus comprising:

a grounded, metal body having a front face and a first cylindrical cavity closed at the cavity front and rear ends, with cylinder axis substantially perpendicular to the front face of the body, with the front end of the cavity terminating on or adjacent to the front face of the body and the rear end of the cavity terminating within the body;

the body having a second cylindrical cavity at the side of and adjacent to, and having a cylinder axis substantially parallel to the axis of, the first cylindrical cavity, with the front end of the second cavity being open and terminating on the front face of the body and the rear end of the second cavity terminating within the body;

the body having a third substantially cylindrical cavity, communicating with the first and second cylindrical cavities in the interior of the body, having a cylinder axis that is substantially parallel to the front face of body, and having a cylinder diameter that is no more than 25% of the first cylindrical cavity, with the third cavity cylinder axis being positioned substantially equidistant from the rear end and the front end of the first cylindrical cavity;

microwave generating means, positioned adjacent to the rear end of and in electromagnetic communication with, the first cylindrical cavity, for generating electromagnetic vibrations of predetermined frequency $\omega_O$ within the first cylindrical cavity;

the body having a cylindrical mixer slot cavity, positioned adjacent to and in communication with the second cylindrical cavity, with a cylinder axis that is substantially perpendicular to the cylinder axes of the second and third cylindrical cavities;

a mixer diode, positioned in the mixer slot cavity, and oriented to sense electromagnetic vibration signals propagating within the slot cavity, for sensing the presence of two or more distinct electromagnetic vibration signals and for forming the product signal of such distinct signals;

low pass filter means, electrically connected to the mixer diode, for receiving the mixer diode product signal and allowing the passage only of product signals with resulting frequencies less than some predetermined threshold frequencies, $\omega_T \leq 2\pi \times 10^8$ rd/sec, in response to receipt of n electromagnetic vibration signal of arbitrary frequency components from the mixer diode;

horn means, mechanically attached to the body and communicating with the second cylindrical cavity at the front end of the cavity, for limiting the direction of radiation emitted from or received by the cavity; and resonant cavity frequency dynamic variation means, electromagnetically communicating with the first cylindrical cavity, for varying the predetermined frequency $\omega_O$ associated with the cavity in a controlled, time-varying manner.

17. Apparatus according to claim 16, wherein said cavity resonant frequency dynamic variation means is a variable capacitance semiconductor diode, positioned adjacent to a side wall or end wall of said first cylindrical cavity.

18. Apparatus according to claim 16, wherein said microwave generating means is drawn from a class consisting of Gunn diodes, FET transistors, bipolar transisitors, avalanche transistors and tunnel diodes.

19. Apparatus according to claim 16, wherein the cross-sectional shape of said first substantially cylindrical cavity is drawn from a class consisting of a circle, an oval, an ellipse, a rectangle and a convex polygon.

20. Apparatus according to claim 16, wherein the cross-sectional shape of said second substantially cylindrical cavity is drawn from a class consisting of a circle, an oval, an ellipse, a rectangle and a convex polygon.

21. Apparatus according to claim 16, wherein the cross-sectional shape of said third substantially cylindrical cavity is drawn from a class consisting of a circle, an oval, an ellipse, a rectangle and a polygon.

22. Apparatus according to claim 16, wherein said first cylindrical cavity includes a tuning screw intuding into said first cavity for adjusting the fundamental resonant frequency for electromagnetic vibrations within said first cavity.

23. Apparatus according to claim 16, wherein said second cylindrical cavity includes a tuning screw intruding into said second cavity for adjusting the resonant frequencies for electromagnetic vibration within said second cavity.

24. Apparatus according to claim 16, wherein said third substantially cylindrical cavity includes a tuning screw intruding into said third cavity for adjusting the resonant frequencies for electromagnetic vibration within said third cavity.

25. Apparatus according to claim 16, further including an oscillator low pass filter, adjacent to said first cylindrical cavity and operationally associated with said microwave generating means, for suppressing the emission of radiation from said first cavity at frequencies above a predetermined second threshold frequency $\omega_{LP}$.

26. Apparatus according to claim 16, further including a small cavity in said rear end of said first cylindrical cavity, the cavity containing and exposing at least a portion of said microwave generating means.

27. Apparatus according to claim 26, further including a tuning screw intruding into said rear end cavity of said first cylindrical cavity for suppressing the excitation of one or more predetermined modes of electromagnetic vibration that would otherwise be excited by said microwave generating means.

28. Apparatus according to claim 16, wherein said predetermined threshold frequency $\omega_T$ staisfies $\omega_T \leq 2\pi \times 30$ rad/sec.

29. Apparatus according to claim 16, wherein said rear end of said second cylindrical cavity includes an overlay or coating of material choosen to reflect electromagnetic vibrations of frequency $\omega_O$ in a predetermined manner.

30. Apparatus according to claim 16, wherein said overlay or coating material is chosen from the class consisting of iron oxide and iron particles.

* * * * *